(12) United States Patent
Kokubo et al.

(10) Patent No.: US 6,291,145 B1
(45) Date of Patent: *Sep. 18, 2001

(54) IMAGE FORMATION METHOD WITH PHOTOSENSITIVE MATERIAL

(75) Inventors: Tadayosi Kokubo, Fujieda; Kazuya Okamoto; Hiroshi Ooki, both of Yokohama; Masato Shibuya, Omiya; Soichi Owa, Tokyo, all of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,683

(22) Filed: Mar. 9, 1998

(30) Foreign Application Priority Data

Mar. 7, 1997 (JP) .................................................. 9-053582

(51) Int. Cl.[7] .................................. G03F 5/24; G03F 7/20; G03F 7/22; G03C 1/73
(52) U.S. Cl. .......................... 430/394; 430/397; 430/327; 430/5; 430/270.1
(58) Field of Search ................. 430/394, 5, 30, 430/325, 917, 312, 285.1, 270.1, 397, 327

(56) References Cited

U.S. PATENT DOCUMENTS

| | | | | |
|---|---|---|---|---|
| 4,155,894 | * | 5/1979 | Gajewski et al. | 252/182.17 |
| 4,857,434 | * | 8/1989 | Klinger | 430/286.1 |
| 4,912,014 | * | 3/1990 | Feldman | 430/202 |
| 5,415,835 | * | 5/1995 | Brueck et al. | 430/394 |
| 5,489,621 | * | 2/1996 | Sato et al. | 430/281.1 |
| 5,512,417 | * | 4/1996 | Ban et al. | 430/917 |
| 5,686,223 | * | 11/1997 | Cleeves | 430/312 |
| 5,698,343 | * | 12/1997 | Sutherland et al. | 430/1 |
| 5,780,206 | * | 7/1998 | Urano et al. | 430/325 |
| 5,789,136 | * | 8/1998 | Sato et al. | 430/270.1 |
| 5,811,222 | * | 9/1998 | Gardner et al. | 430/394 |
| 5,851,707 | * | 12/1998 | Shibuya et al. | 430/394 |
| 5,858,616 | * | 1/1999 | Tanaka et al. | 430/325 |

* cited by examiner

Primary Examiner—Janet Baxter
Assistant Examiner—Sin J. Lee
(74) Attorney, Agent, or Firm—Klarquist Sparkman Campbell Leigh & Whinston, LLP

(57) ABSTRACT

Image-formation methods and photosensitive materials used in such methods are disclosed that form very high-resolution patterns. The photosensitive materials comprise an ingredient that is triggered by a radical to undergo a latent-image-forming reaction. The radicals are produced by photons from an illumination light. Alternatively, the ingredient is triggered by a reactive-intermediate compound that is activated by the exposure-produced radical. The photosensitive materials possess a non-linear sensitivity characteristic in which the latent-image reaction density increases according to the $m^{th}$ power (m>1) of the incident light intensity. The photosensitive material can be applied to a sensitive substrate for exposure. Multiple exposures of the sensitive substrate are performed using a projected mask pattern in the presence of a radical deactivator. The multiple exposures can be performed while: (a) changing the exposure intensity distribution on the photosensitive material, or (b) shifting the projected mask pattern and the sensitive substrate relative to each other by a specified amount, or (c) using a different projected mask pattern for each exposure.

25 Claims, 1 Drawing Sheet

IMAGE FORMATION METHOD WITH PHOTOSENSITIVE MATERIAL

FIELD OF THE INVENTION

This invention pertains to methods for forming fine patterns primarily used in the manufacture of semiconductor elements and liquid crystal panels, and to a photosensitive material that is suited to the formation of such fine patterns using the method.

BACKGROUND OF THE INVENTION

In conventional microlithographic exposure methods, a pattern of features defined by a reticle is illuminated and projected so as to form the pattern on a photosensitive substrate. (The substrate is typically coated with a photoresist or other photosensitive material which makes the substrate "photosensitive". Commonly, the photoresist is "positive" and has high thermal stability.) Upon exposure, a latent image-reaction density $\xi$ as defined in Equation (1) below is typically produced in the photoresist, according to the intensity I of the illuminating light reaching the substrate:

$$\xi = \exp(-CD), \quad D = I^m \cdot t = J \cdot t \tag{1}$$

wherein t is the exposure time and C is a constant determined by the photosensitive material. The exponent m expresses the response dynamics of the photosensitive material relative to the incident light intensity, where m=1 denotes a linear response and m≠1 denotes a non-linear response. As indicated, $I^m$ can be substituted with J, wherein J is the latent image density of the photoresist.

The modulation i(ν) of the irradiance function of the image for a given spatial frequency ν required to form a latent image in the photoresist, assuming spatially incoherent illumination, is given by:

$$i(\nu) = i_0(\nu) \cdot f(\nu) \tag{2}$$

wherein $i_0$ is the modulation of the irradiance function of the object (mask) for a given spatial frequency, f is the transfer function of the optical system for a given spatial frequency (i.e., the optical transfer function "OTF"; also termed the "modulation transfer function" or "MTF"), and ν is the spatial frequency of the pattern on the mask.

The spatial frequency $\nu_0$ at a threshold at which f becomes insignificant from a process viewpoint is expressed by the following equation, wherein λ is the exposure wavelength, NA is the numerical aperture of the projection-optical system on the photoresist side, and $K_1$ is a process constant:

$$\nu_0 = \frac{NA}{2(K_1 \cdot \lambda)} \tag{3}$$

According to Equation (3), the resolution limit of the optical system (i.e., the highest spatial frequency $\nu_c$ that can be imaged by the optical system with incoherent illumination; sometimes termed the "cutoff frequency") is essentially determined by the numerical aperture NA and the exposure wavelength λ (in which instance $K_1$=0.25):

$$\nu_c = \frac{2NA}{\lambda} \tag{4}$$

Thus, high resolution can be obtained by either increasing the numerical aperture NA and/or decreasing the exposure wavelength λ. With these choices in mind, high-NA lenses were developed and various schemes were devised for exploiting short-wavelength light sources, such as excimer lasers, etc., in an effort to improve resolution. However, since the depth of focus ("DOF") of the projection-optical system is expressed by:

$$DOF = \frac{K_2 \cdot \lambda}{NA^2} \tag{5}$$

(wherein $K_2$ is a process-dependent constant), these schemes proved to be impractical since they tended to reduce the DOF and/or increase the size and complexity of the optical system. In addition, the ultimate resolution limit of the photosensitive material could not exceed the resolution limit as dictated by the projection-optical system.

An exposure method offering prospects of exceeding the exposure limit of the projection-optical system was proposed in Japanese Kôkai (laid-open) patent document no. HEI 6-291009. To reproduce a pattern that exceeded the resolution limit of the projection-optical system, multiple exposures were performed on a substrate coated with a photoresist having a non-linear exposure-sensitivity characteristic. The latent-image reaction density with such a photoresist increased according to the $m^{th}$ power (m>1) of the incident light intensity. The latent-image reaction density could also be increased by performing multiple exposures while (a) changing the exposure intensity distribution on the photoresist, or (b) displacing the reticle and substrate relative to each other by a specified amount between exposures, or (c) using a different reticle for each exposure. The consequences of the non-linear exposure-sensitivity are explained below.

In a conventional photolithography system as described above, the light-intensity distribution I(x) created on an image surface by incoherent illumination passing through the projection-optical system from a mask is given by:

$$I(x) = I_0(x) * F(x) \tag{6}$$

wherein $I_0(x)$ is the light-intensity distribution on the "object" (mask), F(x) is the focal intensity distribution F(x) of the projection optical system, x is the position coordinate on the photoresist, and * indicates convolution.

Fourier-transform convolution yields Equation (7) which is the same as Equation (2):

$$i(\nu) = i_0(\nu) \cdot f(\nu). \tag{7}$$

Usually, $\nu_c = 2NA/\lambda$, as shown in Equation (4) above. A resolution that exceeds $\nu_c$ cannot be achieved. However, if, e.g., a photoresist exhibiting second-order (non-linear) response dynamics (wherein m=2 in Equation (1); termed a "two-photon-absorbing resist") is utilized, then the latent-image density exhibits a distribution J(x) according to the square of the exposure-intensity distribution I(x), substituted into Equation (6) as follows:

$$J(x) = (I(x))^2 = [I_0(x) * F(x)]^2. \tag{8}$$

Using Equation (7), the latent-image density distribution j for the given spatial frequency is expressed as:

$$j(v) = [i_0(v) \cdot f(v)] * [i_0(v) \cdot f(v)]. \quad (9)$$

In instances in which the exposure-density distribution exhibits, e.g., a sine profile, Equation (9) indicates that use of such a non-linear photoresist causes the sine profile to have more amplitude than when a linear (first-order) photoresist is used. Such an increase in amplitude of the latent-image density distribution increases the contrast of the resulting image formed in the photoresist.

Since the phase of the sine wave in the latent-density distribution is the same for both linear photoresists and non-linear photoresists, the cut-off frequency $v_c$ of the latent-image density remains unchanged. As a result, it is impossible to form fine patterns at a resolution greater than the resolution limit of the optical system.

The scheme disclosed in the Japan Kôkai patent document no. HEI 6-291009 using non-linear photoresists and multiple exposures represents an attempt to circumvent such a problem by exploiting the following principle. Consider the formation of a focal-point image using an optical system and a non-linear photosensitive material in which m=2, as described above. In such an instance, the focal intensity distribution F(x) caused by the optical system can be considered independently from the illumination conditions. If the desired light-intensity distribution $I_0(x)$ at the object is formed by overlaying focal images, then the latent image density distribution J(x) formed thereby is an accumulation of the light intensities created by the formation of each individual focal image, and is expressed by the following equation:

$$J(x) = I_0(x) * F(x)^2. \quad (10)$$

The latent-image density distribution of the focal image is expressed in Equation (10) as $F(x)^2$, which has more amplitude than the focal-image intensity distribution F(x) created by the optical system. Thus, higher resolution is obtained.

The following equation is obtained by a Fourier transformation of Equation (10):

$$j(v) = i_0(v) \cdot [f(v) * f(v)]. \quad (11)$$

When Equation (11) is compared with Equation (7), the "f*f" term in Equation (11) can be regarded as the OTF of the optical system. The cut-off frequency of the optical system, according to Equation (4), is $4NA/\lambda$. This cut-off frequency is double the cut-off frequency of the OTF expressed in Equation (7). Consequently, a doubling of the resolution is achieved.

In the method disclosed in Japan Kôkai patent document no. HEI 6-291009, resolution is controlled by the exponent denoting the non-linearity of the photosensitive material. In order to double the resolution, a photosensitive material must be used that is non-linear wherein $m \geq 2$, e.g., a "two-photon absorbing resist". However, the sensitivity of conventional non-linear photosensitive materials is low and these materials have an extremely high optical density (Optical Density $(OD) = \log(I/I_0)$, where $I_0$ and $I$ represent the intensity of light incident to and passing through the photosensitive material, respectively). Consequently, an exposure light source and optical system with extremely high intensity must be used to elicit the desired non-linearity from the photosensitive material, which is impractical. In addition, since multiple repeated exposures are performed, each new exposure is considerably affected by the immediately preceding exposure.

SUMMARY OF THE INVENTION

In view of the foregoing, an object of this invention is to provide image-formation methods, and photosensitive materials suitable for such methods, that form very high-resolution patterns without the need to use a special exposure light source or optical system, while nullifying the effects of the immediately preceding exposure.

According to one aspect of the invention, a method is provided for forming an image of a projected pattern on a photosensitive material by exposure to an illumination light. In a first step, a photosensitive material is provided that comprises (i) a first compound that produces a radical upon exposure to the illumination light, and (ii) a second compound that reacts with the radical or reacts with a reactive intermediate formed by a reaction of a third compound with the radical to form a latent image. The photosensitive material exhibits a non-linear photo sensitivity characteristic in which the reaction density of the latent image increases according to the $m^{th}$ power (m>1) of the intensity of the illumination light. In a subsequent step, the photosensitive material is applied to a substrate to form a sensitive substrate. The sensitive substrate is placed relative to a mask and the illumination light to allow the illumination light to project a pattern, defined by the mask, onto the sensitive substrate. While in the presence of a radical deactivator, which deactivates the radical in the photosensitive material, multiple exposures of the sensitive substrate are performed with the projected mask pattern while changing the exposure-intensity distribution on the photosensitive material with each exposure.

According to another aspect of the invention, a method is provided for forming an image of a projected pattern on a photosensitive material by exposure to an illumination light. In a first step, a photosensitive material is provided that comprises (i) a first compound that produces a radical upon exposure to the illumination light, and (ii) a second compound that reacts with the radical or reacts with a reactive intermediate formed by a reaction of a third compound with the radical to form a latent image. The photosensitive material exhibits a non-linear photo sensitivity characteristic in which the reaction density of the latent image increases according to the $m^{th}$ power (m>1) of the intensity of the illumination light. In a subsequent step, the photosensitive material is applied to a substrate to form a sensitive substrate. The sensitive substrate is placed relative to a mask and the illumination light to allow the illumination light to project a pattern, defined by the mask, onto the sensitive substrate. While in the presence of a radical deactivator, multiple exposures of the sensitive substrate are performed using the projected mask pattern. For each exposure, the mask pattern and the sensitive substrate are shifted relative to each other by an amount that differs for each respective exposure so that the pattern exposed on the photosensitive material is shifted. For example, first and second exposures can be performed; between the first and second exposures, the mask pattern and sensitive substrate are shifted relative to each other by one-half the period of the mask pattern. By way of a second example, n exposures are made; between each exposure, the mask pattern and the sensitive substrate are shifted relative to each other by 1/n times the period of the mask pattern.

According to yet another aspect of the invention, a method is provided for forming an image of a projected pattern on a photosensitive material by exposure to an illumination light. In a first step, a photosensitive material is provided that comprises (i) a first compound that produces a radical upon exposure to the illumination light, and (ii) a second compound that reacts with the radical or reacts with a reactive intermediate formed by a reaction of a third compound with the radical to form a latent image. The photosensitive material exhibits a non-linear photo sensitivity characteristic in which the reaction density of the latent image increases according to the $m^{th}$ power (m>1) of the intensity of the illumination light. In a subsequent step, the photosensitive material is applied to a substrate to form a sensitive substrate. The sensitive substrate is placed relative to a mask and the illumination light to allow the illumination light to project a pattern, defined by the mask, onto the sensitive substrate. While in the presence of a radical deactivator, multiple exposures of the sensitive substrate are performed, wherein a different projected mask pattern is used for each exposure.

The radical deactivator can be an ingredient in the photosensitive material. Alternatively, the exposures can be executed in an atmosphere containing a radical-deactivating gas, preferably oxygen. If such a deactivating atmosphere is used, it is preferable to select the partial pressure of the deactivating gas so that the rate at which the radical is deactivated by the deactivating gas proceeds at a desired rate.

With this invention, images can be formed on the sensitive substrate that have very high resolution without having to use a "two-photon-absorbing resist" and/or an extremely high-irradiance light source. In addition, since a variety of chemical reactions that use radicals can be utilized, there is a great deal of latitude in selecting the constituent materials and photosensitive materials so that a variety of objectives can be obtained.

The foregoing and additional features and advantages of the invention will be more readily apparent from the following detailed description, which proceeds with reference to the accompanying drawings.

DETAILED DESCRIPTION

Figure 1:
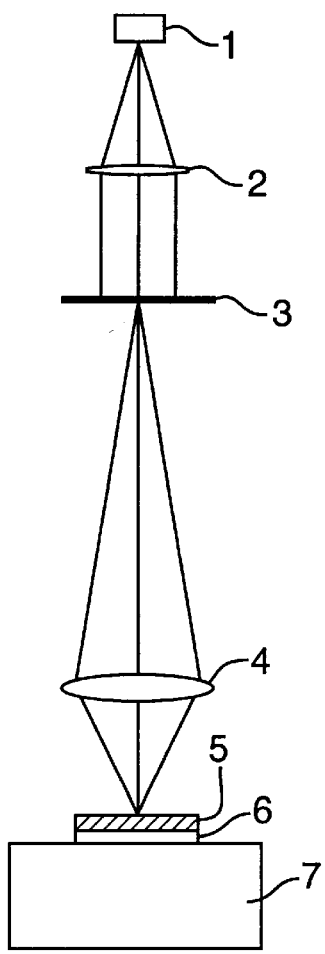
FIG. 1 schematically depicts an example of a projection-exposure apparatus for performing an image-formation method according to the invention.

In an image-formation system according to the invention, the photosensitive material preferably includes (1) a compound that photochemically produces a radical from reaction with one or more photons of the illumination light, (2) a compound that undergoes a reaction with the radical to form a latent image or a compound that undergoes a reaction with a reactive intermediate formed by reaction of the radical with another compound in the photosensitive material, and (3) a compound (termed a "radical deactivator") that deactivates the radical by a quenching reaction, while competing in the reaction that forms the latent image. As an alternative to providing the radical deactivator in the photosensitive material, the radical deactivator can be extraneously introduced to the photosensitive material during exposure.

The photosensitive material in the image-formation system undergoes a reaction, to form a latent image, that is non-linear with respect to the intensity of the light used to make the exposure, so long as the light intensity is above a lower threshold. From the exposure-level threshold, the density of the latent image formed by the reaction increases sharply. By overlaying multiple exposures of the image in a manner as disclosed in Japanese Kôkai patent application no. HEI 6-291009, methods according to the invention provide fine images that exceed the resolution limits of conventional projection-optical systems.

The photosensitive material comprises (a) a compound that produces a radical photochemically, and (b) additional compounds that react with the radical to trigger a latent-image-formation reaction. Latent-image formation occurs in the presence of a radical deactivator that can be included in the photosensitive material composition or can be extraneously introduced to the photosensitive material during exposure. In an exemplary image-formation system according to the invention, the photosensitive material comprises a radical-producing polymer, which can be in a mixture with a radical-producing monomer having unsaturated bonds. In a preferred embodiment, the photosensitive material comprises a radical-polymerization photopolymer in which the imaging reaction proceeds in the presence of the radical deactivator. Various radical producers and reactive monomers, including monomers with unsaturated bonds, known for use in radical polymerization can be used for the photopolymer.

Preferred radical producers include (but are not limited to): (a) photocleaving radical producers such as peroxides, azo compounds, benzoins, organic halogen compounds, disulfide compounds, etc.; (b) hydrogen-extracting radical producers, such as benzophenone, Michler's ketone, thioxanthone, etc.; (c) a radical producer complex formed by an electron-transfer interaction between dyes and other molecules, e.g., a complex of cationic dyes and boron compounds, or a complex of electron-donating dyes and onium salts (i.e., a salt with a positively charged ion such as an ammonium salt); and (d) ternary compound radical producers that further combine a sensitizing dye with an electron-donor complex. Alternatively, any of various other compounds that can produce a radical upon reaction with light can be used. Preferred examples of the monomer for the radical polymerization are any of various compounds having at least one unsaturated bond, e.g., acrylic esters or methacrylic esters of polyvalent alcohols, vinyl compounds, and various oligomeric compounds having at least one unsaturated bond sensitive to radical reaction. Other compounds that can undergo a radical-induced polymerization can also be utilized for the monomer.

The radical deactivator used in the image-formation system serves to "deactivate" the radical (i.e., elimate or reduce the efficacy of the radical during latent-image formation) so that the radical has minimal to no reactivity during a subsequent exposure. The deactivation competes with the latent-image formation reaction induced by the radical, thereby decreasing the efficiency of the latent image formation so that it is non-linear with respect to the intensity of light received during exposure. Examples of radical deactivators that can be added to the photosensitive material prior to exposure include various phenols, amines, quinones, and mercapto compounds. Compounds that readily form chemically stable (relatively non-reactive) compounds upon reaction with radicals, such as hindered phenols, etc., are generally known as polymerization inhibitors and can be used especially effectively in the photosensitive material in this image-formation system. The radical deactivator competes with, and thereby hinders, reactions of the monomer with the radical. As a result, the monomer experiences a diminished efficacy as a photosensitive material in the reaction that forms the latent image.

If the action of the radical deactivator is too weak, then the resolution-improving effect resulting from the overlaid exposure method particular to this image-formation system cannot be obtained. If the action of the radical deactivator is too strong, most of the radicals produced by the photochemical reaction of the radical producer are prematurely deactivated, causing a marked decrease in sensitivity. To achieve optimum latent-image formation results, the concentration of the radical deactivator must be individually selected based on the composition of the other photosensitive material ingredients, i.e., the light radical producer and monomer ingredients, in light of the foregoing considerations.

The radical deactivator can be a gas, most preferably oxygen. With such a radical deactivator, exposure can be performed with the photosensitive material exposed to an atmosphere containing the deactivating gas (termed a "deactivating atmosphere"). In such an instance, the photosensitive material need not contain a radical deactivator compound. The photosensitive material preferably has an optimal oxygen permeability, or the deactivating atmosphere preferably has an optimal partial pressure of oxygen relative to the rate at which the radical is deactivated in order to fully exploit the effect of the invention.

It is also possible to substitute one of the various reagents used during the preparation of the photosensitive material, e.g., dissolved oxygen in the solvent, etc., as the radical deactivator.

The latent image that is formed in a layer of the photosensitive material (applied to a substrate) by light exposure is developed using, e.g., a suitable solvent or aqueous alkali solution. Such development transforms the layer of photosensitive material into a resist image that can be used as an etching mask. If the exposed and unexposed areas of the photosensitive material react differently to silating agents, such as hexamethyldisilazane, exposure can occur in a silating atmosphere. In such an instance, the latent image can be converted into a resist mask by reactive-ion etching using oxygen gas.

Another example of a preferred embodiment of the image-formation system of this invention comprises a photosensitive material in which an acid molecule is produced through a photochemical radical formation and a subsequent conversion reaction involving a proton ($H^+$). The proton, functioning as an acid, is used to catalyze various subsequent reactions usable for latent-image formation. In this embodiment the radical is produced by reaction with photons of the illuminating light. The radical extracts a hydrogen from a hydrogen donor present in the photosensitive material, ultimately producing a proton ($H^+$). The proton functions as an acid that can react with another ingredient in the photosensitive material to produce a latent image. Any of various acid-catalyzed reactions that cause a solubility change to the developer being used in the subsequent image-development process for the latent-image formation can be utilized to form the latent image. Resists that exploit such reactions are well-known, and are referred to as "chemical sensitizing (amplification) resists". For example, acid-catalyzed reactions comprising degradation reactions of acetal or ester groups and cross-linking reactions of methylol or epoxy groups are particularly effective.

Photosensitive materials that utilize an acid preferably comprise: (1) a radical producer that produces an acid, a hydrogen-donor compound, or a group that converts the radical into an acid; (2) a compound that undergoes a latent-image-forming reaction with the acid; and (3) a radical deactivator. However, if exposure is performed in a deactivating atmosphere, then the radical deactivator need not be initially present in the photosensitive material.

If the latent image is produced by reaction with an acid, it is most preferable to use a photo-cleaving radical producer such as any of those described above. Examples of bonds that can be cleaved by a photochemically formed radical include C-halogen bonds, C—S bonds, S—S bonds, and S—N bonds, etc. Since C—C bonds and the like also undergo radical cleavage by exposure to light having sufficient energy, compounds with such bonds can be used as the radical producer in this image-formation system.

It may be necessary to heat the photosensitive material layer after exposure to accelerate the acid-catalyzed reaction that forms the latent image. A latent image obtained in such a way can be transformed into a resist image by performing a development step.

The photosensitive material can comprise a first compound that photochemically produces a radical, and a second compound that undergoes a reaction with a reactive intermediate formed by a reaction between the radical and a third compound in the photosensitive material to form a latent image. With such a photosensitive material, the first and second compounds preferably are selected so that the reactivity of exposed portions and unexposed portions of the material to the third compound is changed as a result of the radical reaction. The third compound is preferably a silating agent. By immersing the light-exposed photosensitive material in a gas or liquid containing the silating compound, a latent image can be formed. A latent image formed in this manner can be developed by reactive-ion etching using oxygen gas and thereby transformed into a relief image that can be used as a resist.

The photosensitive material also can comprise any of various other binder polymers, light-absorbing ingredients, spectral sensitizers, solvent regulators (e.g., any of various dissolution promoters and inhibitors), and/or surfactants. Whereas the photosensitive materials can be used independently, they also can be used as part of a multi-layered resist member in which other photosensitive material layers are present.

Any of the photosensitive materials described above forms a latent image by being exposed using an apparatus as schematically shown in FIG. 1. Light emitted from a light source 1 passes through an illumination-optical system 2 and illuminates a reticle (mask) 3. Light transmitted by the reticle 3 passes through a projection-optical system 4 to produce a reduced projection image of the reticle 3 on a wafer 6 mounted on a stage 7. The photosensitive material 5 is applied to the wafer 6. This exposure apparatus is entirely contained inside a sealed housing, typically under a vacuum or a reduced-pressure deactivating atmosphere. In this apparatus, it is not necessary to use a special light source or optical system, and conventional components can be used.

To expose the wafer 6, multiple exposures can be performed while: (a) changing the exposure-intensity distribution on the photosensitive material at each exposure; or (b)

shifting the reticle (mask pattern) and the sensitive substrate relative to each other by a specified amount per each exposure so that the pattern being exposed on the photosensitive material is shifted with each exposure; or (c) using a different reticle for each exposure. A representative process of image formation using the image-formation system of this invention is explained below using exposure method (b).

Figure 2:
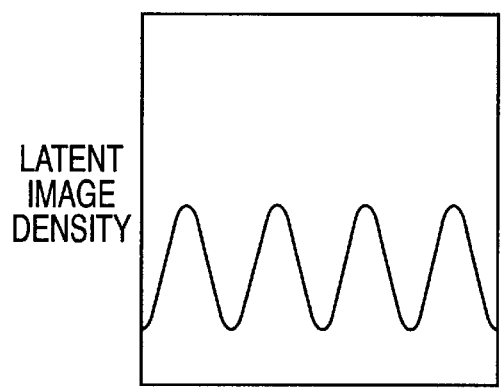
FIG. 2 is a graph of the intensity distribution of the optical image versus wafer position.
Figure 3:
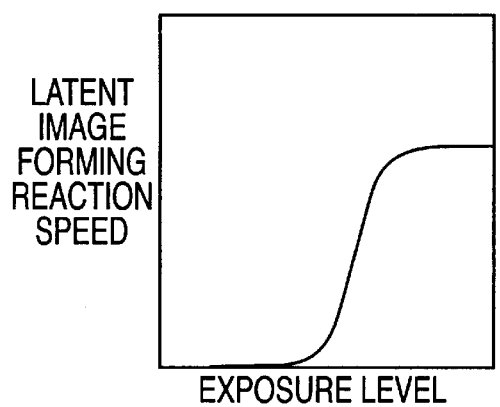
FIG. 3 is a graph showing the non-linearity of a photosensitive material used in the image-formation method according to the invention.

According to diffraction theory, if an image of a periodic pattern is formed at near a resolution limit, the image-intensity distribution of a periodic pattern having a period that is less than $\lambda/NA$ is a sine wave, as shown in FIG. 2. But, the intensity distribution of the corresponding latent image formed by the photosensitive material 5 is not a sine wave but rather has a profile as shown in FIG. 3. (In FIG. 3, the abscissa is exposure intensity level, and the ordinate is reaction rate by which the latent image is formed.) Since formation of the latent image proceeds by a reaction involving radicals, the kinetics by which the latent image is formed are non-linear relative to the exposure intensity.

Figure 4:
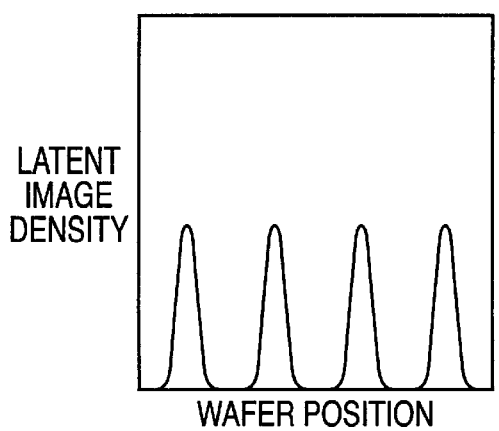
FIG. 4 is a profile of a representative pattern of the latent image in a photosensitive material after multiple exposures.

The non-linearity shown in FIG. 3 allows a substantial increase in contrast to be realized. Even though the intensity distribution of the optical image is that of a sine wave (as shown in FIG. 2), the resulting latent image formed by the photosensitive material 5 has an intensity distribution characterized by sharp peaks, as shown in FIG. 4. Note that the respective periods of the waveforms in FIGS. 2 and 4 are identical. Exploiting these characteristics, it is possible to simultaneously realize high contrast and high resolution.

Figure 5:
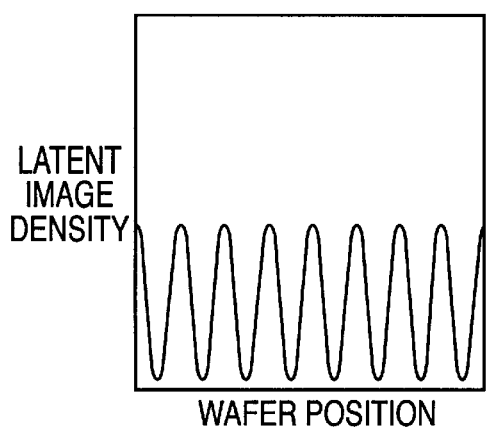
FIG. 5 is a profile of a representative pattern of the latent image in a photosensitive material after multiple exposures, where a second exposure is shifted one-half period from a first exposure.

After a first exposure is performed and the latent image shown in FIG. 4 is formed by the photosensitive material 5, the wafer 6 or reticle 3 is shifted in a direction perpendicular to the axis of the exposure light. The amount of shift is half the period of the pattern. After shifting, a second exposure is performed, preferably under the same conditions as the first exposure. A latent image is formed by the second exposure. The latent image formed in the second exposure has an intensity distribution as shown in FIG. 4. Since the pattern on the reticle 3 is shifted in the second exposure by a half period relative to the first exposure, the latent image obtained in the second exposure is a composite of the distribution shown in FIG. 4 and has a distribution similar to the FIG. 4 distribution but shifted one-half period. The composite latent image has a profile as shown in FIG. 5.

Thus, if the period of the pattern on the mask is $\lambda/(2NA)$, the corresponding pattern in the photosensitive material can have a period as small as $\lambda/(4NA)$ by this method. The fact that a pattern can be formed having a resolution in excess of the diffraction limit is due, inter alia, to the latent image being transformed by the non-linearity of the radical polymerization reaction in the photosensitive material 5 relative to the exposure level. This results in the latent image having a high spatial frequency.

In the method as described above, the reticle 3 and wafer 5 are shifted, between the first and second exposures, by one-half period. However, if such an amount of shifting produces too much contrast, exposure can be performed n times, with each shift being 1/n of a period before performing each exposure. Thus, it is possible to form a pattern having a period as fine as $\lambda/(2nNA)$.

In the foregoing, either the photosensitive material 5 must contain a radical deactivator or the exposure must be performed in a deactivating atmosphere. If the radicals produced in the first exposure were to persist into the second exposure, the latent image formed by the second exposure could be adversely affected by the image formed during the first exposure. This would cause a marked loss of resolution.

The presence of a radical deactivator (either in situ or provided by a deactivating atmosphere) ensures that radicals produced by the first exposure are substantially entirely deactivated at the time of the second exposure.

The concentration of the radical deactivator in the photosensitive material 5 or the partial pressure of oxygen in the deactivating atmosphere is preferably at a pre-determined optimal level. An insufficient amount of radical deactivator or oxygen will result in incomplete deactivation of the radicals by the time of the second exposure. If the concentration or partial pressure is too high, then the rate of the radical polymerization reaction will be decreased to a level having a detrimental effect on latent-image formation. The optimum amount of radical deactivator or partial pressure of oxygen must be selected with regard to these considerations.

The invention is described in greater particularity below in connection with example embodiments that represent the current best mode of the invention.

EXAMPLE EMBODIMENT 1

A photosensitive material corresponding to this example embodiment was prepared by uniformly dissolving, in a propylene glycol monomethylether acetate solvent, 10 parts by weight of a benzylmethacrylate/2-hydroxyethylmethacrylate/methacrylic acid copolymer (molar ratio 31:5:14) having a weight-average molecular weight of 30,000, 10 parts by weight of dipentaerythritol hexa-acrylate, 0.5 parts by weight of 4-{3'-bromo-4'-N-[bis(ethoxycarbonylmethyl)aminophenyl]}-2,6-bis(trichloromethyl)-S-triazine, 0.006 parts by weight of "Megafak F177" (a fluorine-containing surfactant made by Dainippon Ink & Chemicals, Inc.), and 0.007 parts by weight of hydroquinone monomethylether. The radical deactivator in this case was the hydroquinone monomethylether and dissolved oxygen in the solvent.

The photosensitive material formulated as above was applied to a wafer 6 by spin coating. Using the exposure device shown in FIG. 1, a first exposure was performed under a vacuum. After the first exposure, the wafer 6 was shifted laterally a distance equal to half the period of the latent-image pattern. Then, a second exposure was performed under the same conditions as the first exposure. After completing the second exposure, the latent-image pattern was developed and etched. According to test sample data, the achieved resolution was $\lambda/(4NA)$, which was in excess of the resolution limit of the optical system in the exposure device.

EXAMPLE EMBODIMENT 2

A photosensitive material corresponding to this example embodiment was prepared by uniformly dissolving, in a propylene glycol monomethylether acetate solvent, 20 parts by weight of a meta-cresol/para-cresol novolac copolymer (molar ratio 6:4) having a weight-average molecular weight of 4,000, 2.3 parts by weight of "Nialac 30M" (a methylolated melamine compound (cross-linker) made by Sanwa Chemical Co.), 0.95 parts by weight of 4-(4'-methoxystyryl)-2,6-bis(trichloromethyl)-S-triazine, 0.18 parts by weight of N-phenylene diethanolamine, 0.4 parts by weight of anthranilic acid, and 0.02 parts by weight of "Trichid 306" (Yokohama Rubber). The radical deactivator in this example was dissolved oxygen in the solvent.

Exposure was performed as described in Example Embodiment 1. Examination of test samples indicated that the resolution obtained with this example embodiment was $\lambda/(4NA)$, which exceeded the resolution limit of the optical system in the exposure device.

With this invention, as described above, a very-high-resolution image is produced without having to use a "two-photon-absorbing resist" (such materials are not practical because they require a very high irradiance light source) while eliminating effects of residual radicals. Since any of various chemical reactions that utilize radicals can be utilized, considerable latitude is provided in selecting the ingredients used to formulate the photosensitive material for any of various specific applications.

While the present invention has been described in connection with preferred embodiments, it will be understood that the invention is not limited to those embodiments. On the contrary, the invention is intended to cover all alternatives, modifications, and equivalents as may be included within the spirit and scope of the invention as defined in the appended claims.

What is claimed is:

1. A method for forming an image of a projected pattern on a photosensitive material by exposure to an illumination light, the method comprising the steps:
   (a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which the latent image reaction density increases according to the $m^{th}$ power (m>1) of the intensity of the illumination light;
   (b) applying the photosensitive material to a substrate to form a photosensitive substrate, and placing the photosensitive substrate relative to a mask and the illumination light to allow the illumination light to project a pattern, defined by the mask, onto the photosensitive substrate;
   (c) in the presence of a radical deactivator, performing a first exposure of the photosensitive substrate with the projected mask pattern as projected by the illumination light; and
   (d) performing a second exposure of the photosensitive substrate with the mask pattern, as projected by the illumination light, while changing the exposure-intensity distribution on the photosensitive material with each exposure, wherein the radical produced by the first exposure is substantially deactivated at the time of the second exposure.

2. The method of claim 1, wherein the photosensitive material comprises a benzylmethacrylate/2-hydroxyethylmethacrylate/methacrylic acid copolymer, dipentaerythritol hexa-acrylate, 4-{3'-bromo-4'-N-[bis(ethoxycarbonylmethyl)aminophenyl]}-2,6-bis(trichloromethyl)-S-triazine, a fluorinated surfactant, and hydroquinone monomethylether in a propylene glycol monomethylether acetate solvent.

3. The method of claim 1, wherein, in steps (c) and (d), the first and second exposures, respectively, are performed in an atmosphere containing a radical-deactivating gas.

4. The method of claim 3, wherein the radical-deactivating gas is oxygen.

5. The method of claim 1, wherein the photosensitive material is provided from a photosensitive composition, the photosensitive composition comprising:
   (a) 10 parts by weight of a benzylmethacrylate/2-hydroxyethylmethacrylate/methacrylic acid copolymer (molar ratio 31:5:14) having a weight-average molecular weight of 30,000;
   (b) 10 parts by weight of dipentaerythritol hexa-acrylate;
   (c) 0.5 parts by weight of 4-{3'-bromo-4'-N-[bis(ethoxycarbonylmethyl)aminophenyl]}-2,6-bis(trichloromethyl)-S-triazine;
   (d) 0.007 parts by weight of hydroquinone monomethylether; and
   (e) a propylene glycol monomethylether acetate solvent, wherein a part by weight is with respect to a combined weight of (a), (b), (c), and (d).

6. A method for forming an image of a projected pattern on a photosensitive material by exposure to an illumination light, the method comprising the steps:
   (a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which the latent image reaction density increases according to the $m^{th}$ power (m>1) of the intensity of the illumination light;
   (b) applying the photosensitive material to a substrate to form a photosensitive substrate, and placing the photosensitive substrate relative to a mask and the illumination light to allow the illumination light to project a pattern, defined by the mask, onto the photosensitive substrate;
   (c) in the presence of a radical deactivator, performing a first exposure of the photosensitive substrate with the projected mask pattern as projected by the illumination light; and
   (d) performing a second exposure of the photosensitive substrate with the mask pattern, as projected by the illumination light, wherein the mask pattern and photosensitive substrate are shifted relative to each other by a predetermined amount, and wherein the radical produced by the first exposure is substantially deactivated at the time of the second exposure.

7. The method of claim 6, wherein the photosensitive material comprises a benzylmethacrylate/2-hydroxyethylmethacrylate/methacrylic acid copolymer, dipentaerythritol hexa-acrylate, 4-{3'-bromo-4'-N-[bis(ethoxycarbonylmethyl)aminophenyl]}-2,6-bis(trichloromethyl)-S-triazine, a fluorinated surfactant, and hydroquinone monomethylether in a propylene glycol monomethylether acetate solvent.

8. The method of claim 7, wherein the photosensitive material comprises, in the solvent:
   (i) 10 parts by weight of the benzylmethacrylate/2-hydroxyethylmethacrylate/methacrylic acid copolymer (molar ratio 31:5:14) with a weight-average molecular weight of 30,000;
   (ii) 10 parts by weight of the dipentaerythritol hexa-acrylate;
   (iii) 0.5 parts by weight of the 4-{3'-bromo-4'-N-[bis(ethoxycarbonylmethyl)aminophenyl]}-2,6-bis(trichloromethyl)-S-triazine;
   (iv) 0.006 parts by weight of the fluorinated surfactant; and
   (v) 0.007 parts by weight of the hydroquinone monomethylether, wherein a part by weight is with respect to a combined weight of (i), (ii), (iii), (iv), and (v).

9. The method of claim 6, wherein the photosensitive material comprises meta-cresol/para-cresol novolac copolymer, methylolated melamine, 4-(4'-methoxystyryl)-2,6-bis(trichloromethyl)-S-triazine, N-phenylene diethanolamine, and anthranilic acid, in a propylene glycol monomethylether acetate solvent.

10. The method of claim 6, wherein:

the mask pattern has a period; and between the first and second exposures, the mask pattern and photosensitive substrate are shifted relative to each other by one-half the period of the mask pattern.

11. The method of claim 6, wherein, in steps (c) and (d), the exposures are performed in an atmosphere containing a radical-deactivating gas.

12. The method of claim 11, wherein the radical-deactivating gas is oxygen.

13. A method for forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which the latent image reaction density increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the sensitive substrate with the projected mask pattern, wherein the mask pattern and sensitive substrate are shifted relative to each other from one exposure to the next by an amount that differs for each respective exposure, wherein the photosensitive material comprises:

(i) 20 parts by weight of a meta-cresol/para-cresol novolac copolymer (molar ratio 6:4) having a weight-average molecular weight of 4,000;

(ii) 2.3 parts by weight of methylolated melamine;

(iii) 0.95 parts by weight of 4-(4'-methoxystyryl)-2,6-bis(trichloromethyl)-S-triazine;

(iv) 0.18 parts by weight of N-phenylene diethanolamine; and (v) 0.4 parts by weight of anthranilic acid in a propylene glycol monomethylether acetate solvent, wherein a part by weight is with respect to a combined weight of (i), (ii), (iii), (iv), and (v), exclusive of the solvent.

14. A method for forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a latent-image reaction density increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate;

(c) in the presence of a radical deactivator, performing a first exposure of the photosensitive substrate with the mask pattern as projected by the illumination light; and (d) performing a second exposure of the photosensitive substrate with a different mask pattern as projected by the illumination light, wherein the radical produced by the first exposure is substantially deactivated at the time of the second exposure.

15. The method of claim 14, wherein, in steps (c) and (d), the exposures are performed in an atmosphere containing a radical-deactivating gas.

16. The method of claim 15, wherein the radical-deactivating gas is oxygen.

17. A method for forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a reaction density of the latent image increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the photosensitive substrate with the mask pattern, as projected by the illumination light, while changing the exposure-intensity distribution on the photosensitive material with each exposure, wherein the radical produced by a first exposure is substantially deactivated at the time of a second exposure.

18. The method of claim 17, wherein the photosensitive material comprises a benzylmethacrylate/2-hydroxyethylmethacrylate/methacrylic acid copolymer, dipentaerythritol hexa-acrylate, 4-{3'-bromo-4'-N-[bis(ethoxycarbonylmethyl)aminophenyl]}-2,6-bis(trichloromethyl)-S-triazine, a fluorinated surfactant, and hydroquinone monomethylether in a propylene glycol monomethylether acetate solvent.

19. The method of claim 17, wherein, in step (c), the multiple exposures are performed in an atmosphere containing a radical-deactivating gas.

20. A method for forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a reaction density of the latent image increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the photosensitive substrate the mask pattern, as projected by the illumination light, wherein the mask pattern and photosensitive substrate are shifted relative to each other by a predetermined amount from one exposure to the next, and wherein the radical produced in a first exposure is substantially deactivated at the time of a second exposure.

21. A method for forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a reaction density of the latent image increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the photosensitive substrate using the illumination light and a different projected mask pattern for each exposure, wherein the radical produced by a first exposure is substantially deactivated at the time of a second exposure.

22. A method for manufacturing a semiconductor device by forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a reaction density of the latent image increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the photosensitive substrate with the mask pattern as projected by the illumination light, wherein the mask pattern and photosensitive substrate are shifted relative to each other by a predetermined amount from one exposure to the next, and wherein the radical produced by a first exposure is substantially deactivated at the time of a second exposure.

23. The method of claim 22, wherein:

the mask pattern has a period; and in step (c), n exposures are performed; and between each exposure, the mask pattern and photosensitive substrate are shifted relative to each other by 1/n times the period of the mask pattern.

24. A method for manufacturing a semiconductor device by forming an image of a projected pattern on a photosensitive material by exposure to an illumination light, the method comprising the steps:

(a) providing a photosensitive material that comprises (i) a first compound that, upon exposure to the illumination light, produces a radical, and (ii) a second compound that reacts with the radical or reacts with a reactive intermediate formed by reaction of a third compound with the radical to form a latent image, the photosensitive material exhibiting a non-linear photosensitivity characteristic in which a reaction density of the latent image increases according to the $m^{th}$ power (m>1) of the intensity of the illumination light;

(b) applying the photosensitive material to a substrate to form a photosensitive substrate, and placing the photosensitive substrate relative to a mask and the illumination light to allow the illumination light to project a pattern, defined by the mask, onto the photosensitive substrate; and (c) in the presence of a radical deactivator, performing multiple exposures of the photosensitive substrate using the illumination light and a different projected mask pattern for each exposure, wherein the radical produced by a first exposure is substantially deactivated at the time of a second exposure.

25. A photosensitive composition, comprising:

(a) 20 parts by weight of a meta-cresol/para-cresol novolac copolymer (molar ratio 6:4) having a weight-average molecular weight of 4,000;

(b) 2.3 parts by weight of methylolated melamine;

(c) 0.95 parts by weight of 4-(4'-methoxystyryl)-2,6-bis (trichloromethyl)-S-triazine;

(d) 0.18 parts by weight of N-phenylene diethanolamine;

(e) 0.4 parts by weight of anthranilic acid; and (f) a propylene glycol monomethylether acetate solvent, wherein a part by weight is with respect to a combined weight of (a), (b), (c), (d), and (e).

* * * * *

UNITED STATES PATENT AND TRADEMARK OFFICE
CERTIFICATE OF CORRECTION

PATENT NO.    : 6,291,145 B1
DATED         : September 18, 2001
INVENTOR(S)   : Kokubo et al.

It is certified that error appears in the above-identified patent and that said Letters Patent is hereby corrected as shown below:

Column 2,
Line 52, change "projection optical" to -- projection-optical --

Column 3,
Line 56, change "resist"." to -- resist." --

Column 4,
Line 18, change "photo sensitivity" to -- photosensitivity --
Line 41, change "photo sensitivity" to -- photosensitivity --

Column 5,
Line 5, change "photo sensitivity" to -- photosensitivity --

Column 7,
Line 67, change "resists"." to -- resists." --

Column 9,
Line 46, change "λ(4NA)" to -- λ/(4NA) --
Line 50, change "radical poly-merization" to -- radical-polymerization --

Signed and Sealed this

Seventh Day of May, 2002

Attest:

JAMES E. ROGAN
Attesting Officer        Director of the United States Patent and Trademark Office